United States Patent
Wong et al.

(10) Patent No.: US 6,562,648 B1
(45) Date of Patent: May 13, 2003

(54) STRUCTURE AND METHOD FOR SEPARATION AND TRANSFER OF SEMICONDUCTOR THIN FILMS ONTO DISSIMILAR SUBSTRATE MATERIALS

(75) Inventors: William S. Wong, Berkeley, CA (US); Michael A. Kneissl, Mountain View, CA (US)

(73) Assignee: Xerox Corporation, Stamford, CT (US)

( * ) Notice: Subject to any disclaimer, the term of this patent is extended or adjusted under 35 U.S.C. 154(b) by 115 days.

(21) Appl. No.: 09/648,187

(22) Filed: Aug. 23, 2000

(51) Int. Cl.[7] ................................................ H01L 21/00
(52) U.S. Cl. ...................... 438/46; 438/33; 438/455; 438/458; 438/460; 438/464; 438/977
(58) Field of Search .................. 438/22, 33, 46, 438/455, 458, 459, 460, 464, 478, 479, 483, 788, 795, 796, 977; 257/94, 98; 216/62, 65

(56) References Cited

U.S. PATENT DOCUMENTS

| | | | |
|---|---|---|---|
| 5,391,257 A | * 2/1995 | Sullivan et al. | ............. 438/458 |
| 5,985,687 A | * 11/1999 | Bowers et al. | ................ 438/46 |
| 6,033,995 A | * 3/2000 | Muller | ........................ 438/719 |
| 6,071,795 A | 6/2000 | Cheung et al. | ............. 438/458 |
| 6,214,733 B1 | * 4/2001 | Sickmiller | .................. 438/691 |
| 6,320,206 B1 | * 11/2001 | Coman et al. | ................ 257/94 |
| 6,365,429 B1 | * 4/2002 | Kneissl et al. | ................ 438/46 |

OTHER PUBLICATIONS

Wong et al., "Ubiquitous Blue LEDs: The Integration of GaN Thin Films with Dissimilar Substrate Materials by Wafer Bonding and Laser Lift–off," *Compound Semiconductor*, Nov./Dec. 1999, pp. 54–56.

Wong et al., "Integration of GaN Thin Films with Dissimilar Substrate Materials by Pd–In Metal Bonding and Laser Lift–off," *Journal of Electronic Materials*, vol. 28, No. 12, 1999, pp. 1409–1413.

Song et al., "A Vertical Injection Blue Light Emitting Diode in Substrate Separated InGaN Heterostructures," *Applied Physics Letters*, vol. 74, No. 24, Jun. 14, 1999, pp. 3720–3722.

Song et al., "A Quasicontinous Wave, Optically Pumped Violet Vertical Cavity Surface Emitting Laser," *Applied Physics Letters*, vol. 76, No. 13, Mar. 27, 2000, pp. 1662–1664.

Song et al., "A Vertical Cavity Light Emitting InGaN Quantum Well Heterostructure," Applied Physics Letters, vol. 74, No. 23. Jun. 7, 1999, pp. 3441–3443.

(List continued on next page.)

*Primary Examiner*—Amir Zarabian
*Assistant Examiner*—Maria Guerrero
(74) *Attorney, Agent, or Firm*—Kent M. Chen

(57) ABSTRACT

A method for placing nitride laser diode arrays on a thermally and electrically conducting substrate is described. The method uses an excimer laser to detach the nitride laser diode from the sapphire growth substrate after an intermediate substrate has been attached to the side opposite the sapphire substrate. A secondary layer is subsequently deposited to act as a transfer support structure and bonding interface. The membrane is released from the intermediate substrate and a thermally conducting substrate is subsequently bonded to the side where the sapphire substrate was removed. Similarly, the secondary layer may be used as the new host substrate given an appropriate thickness is deposited prior to removal of the intermediate substrate.

10 Claims, 9 Drawing Sheets

OTHER PUBLICATIONS

Wong et al., "Structural and Optical Quality of GaN/Metal/Si Heterostructure Fabricated by Excimer Laser Lift–Off," *Applied Physics Letters*, vol. 75, No. 13, Sep. 27, 1999.

Wong et al., "Fabrication of Thin–Film InGaN Light–Emitting Diode Membranes by Laser Lift–Off," *Applied Physics Letters*, vol. 75, No. 10, Sep. 06, 1999, pp. 1360–1362.

Wong et al., "$In_xGa_{1-x}N$ Light Emitting Diodes on Si Substrates Fabricated by Pd–In Metal Bonding and Laser Lift–Off," *Applied Physics Letters*, vol. 77, No. 18, Oct. 30, 2000.

Kuramata, A. Et Al. "Room–Temperature Continuous Wave Operation of InGaN Laser Diodes with Vertical Conducting Structure on SiC Substrate," Japanese Journal of Applied Physics, vol. 37, Part 2, No. 11B, Nov. 15, 1998, pp. L1373–L1375.

Nakamura, S. Et Al. "Continuous Wave Operation of InGaN/GaN/AlGaN–Based Laser Diodes Grown on GaN Substrates," Applied Physics Letters, vol. 72. No. 16, Apr. 20, 1998, pp. 2014–2016.

Nakamura, S. And Fasol, G. The Blue Laser Diode: GaN Based Light Emitters and Lasers, Springer–Verlag, Berlin, 1997, pp. 283–291 and pp.300–304.

Wong, W.S. Et Al. "Damage–Free Seperation of GaN Thin Films from Sapphire Substrates," Applied Physics Letters, vol. 72, No. 5, Feb. 2, 1998, pp. 599–601.

Wong, W.S. Et Al. "Integration of GaN Thin Films with Dissimilar Substrate Materials by Pd–In Metal Bonding and Laser Lift–Off," Journal of Electronic Materials, vol. 28, No. 12, 1999, pp. 1409–1413.

* cited by examiner

STRUCTURE AND METHOD FOR SEPARATION AND TRANSFER OF SEMICONDUCTOR THIN FILMS ONTO DISSIMILAR SUBSTRATE MATERIALS

BACKGROUND OF THE INVENTION

The present invention relates generally to the field of laser diodes, and more particularly to transfer of short-wavelength nitride-based laser diodes from transparent substrate materials onto dissimilar substrates.

Short-wavelength nitride based laser diodes provide smaller spot size and a better depth of focus than red and infrared (IR) laser diodes for laser printing operations and other applications. Single-spot nitride laser diodes have applications in areas such as optical storage.

Laser diode arrays are desirable for application to high-speed laser printing. Printing at high speeds and at high resolution requires laser arrays due to the fundamental limits of polygon rotation speed, laser turn-on times and laser power. Laser diode arrays have previously been employed using red and infrared laser diode structures. Dual-spot red lasers and quad-spot infrared lasers have been used for laser printers.

Laser diodes based on higher bandgap semiconductor alloys such as AlGaInN have been developed. Excellent semiconductor laser characteristics have been established in the near-UV to violet spectrum, principally by Nichia Chemical Company of Japan. See for example, S. Nakamura et al., "CW Operation of InGaN/GaN/AlGaN-based laser diodes grown on GaN substrates", Applied Physics Letters, Vol. 72(16), 2014 (1998) and S. Nakamura and G. Fasol, "The Blue Laser Diode-GaN based Light Emitters and Lasers", (Springer-Verlag, 1997), A. Kuramata et al., "Room-temperature CW operation of InGaN Laser Diodes with Vertical Conducting Structure on SiC Substrate", Japanese Journal of Applied Physics, Vol. 37, L1373 (1998) all of which are incorporated by reference in their entirety.

Extension of dual-spot lasers or quad-spot lasers to shorter wavelengths enables printing at higher resolution. The architecture for short wavelength laser diodes has needed to be different because of the misalignment of the crystallographic orientation between the sapphire and the GaN epitaxial layer. Therefore mirror facets formed by cleaving on laser diodes with sapphire substrates exhibit increased surface roughness and reduced reflectivity. The growth on sapphire substrates has also required that the p-electrode and n-electrode have to be formed on the same surface, typically with a lateral n-contact in contrast to laser diodes on conductive substrates which have a backside n-contact.

A group from the University of California has developed a technique for separation of GaN films from sapphire substrates using an UV-excimer laser. The University of California technique uses an ultraviolet excimer laser to decompose a thin portion of the GaN layer at the interface with the sapphire substrate. By proper adjustment of the excimer laser flux, the interfacial GaN is decomposed into Ga and N with minimal damage. Subsequently, the GaN film is removed by gentle heating of the remaining Ga metal which has a melting point of 30° C. at the film-substrate interface. See W. S. Wong et al., "Damage-free separation of GaN thin films from sapphire substrates", Applied Physics Letters, Vol. 72, 599 (1998) which is incorporated by reference in its entirety.

SUMMARY OF THE INVENTION

Architectures using insulating substrates allow the economical construction of nitride based laser diodes and laser diode arrays. Currently, most advanced nitride based single laser structures are grown on insulating sapphire ($Al_2O_3$) substrates which are optically transparent. The use of optically transparent insulating substrates for laser diode arrays presents a special problem in providing electrical contacts for the laser diodes. In contrast to the situation where conducting substrates are used, insulating substrates cannot provide a common backside contact for all laser diodes in an array. Hence, providing electrical contacts to laser diode arrays on insulating substrates has required the use of special architectures.

In an embodiment in accordance with the invention, removal of the optically transparent insulating substrate after growth of the laser diode or laser diode array structures simplifies providing electrical contacts to the laser diode or laser diode arrays and avoids special architectures while allowing a superior heat sink to be attached to the laser diode or laser diode arrays. The laser diode or laser diode array may be attached to a thermally conductive wafer or directly mounted onto a heatsink after substrate removal by soldering, thermo-compression bonding or other means well known to those of ordinary skill in the art. Removal of the optically transparent insulating substrate requires the attachment of a support substrate as an intermediate step. Subsequent transfer of the laser diode or laser diode array after removal of the support substrate requires a secondary support to provide mechanical rigidity to the laser diode or laser diode array. Adding a thermally conductive substrate to the laser diode or laser diode array before removal of the insulating substrate allows positioning of the thermally conductive substrate on the side of the laser diode or laser diode array closer to the laser active region for more effective heat sinking than if the laser diode or laser diode array is attached to the thermally conductive substrate after removal of the insulating substrate. This is particularly important in the case of independently addressable laser diode arrays used in high-resolution and high-speed printing. Any cross-talk between laser diodes in an array adversely effects the performance of the printing system and is to be avoided. Thermal cross-talk is a major component in the case of nitride based lasers grown on sapphire because of the comparatively poor thermal conductivity of the sapphire substrate. Removal of the sapphire substrate greatly reduces the thermal impedance and consequently any thermal cross-talk is also reduced.

The nitride laser membrane may be cleaved to create parallel mirror facets before attachment to the new host substrate. The nitride laser membrane may also be aligned during the attachment and transfer process with a new crystallographically oriented host substrate and cleaved to form mirror facets for the laser diode or laser diode array. Cleaved rather than etched mirror facets result in perfectly parallel, vertical, and smooth mirrors which are critical for properly optimized laser operation. Also a free-standing nitride laser membrane may be cleaved directly without attachment to any substrate to form high-quality mirror facets.

BRIEF DESCRIPTION OF THE DRAWINGS

A more complete appreciation of the invention and many of the attendant advantages thereof will be readily obtained and understood by referring to the following detailed description and the accompanying drawings in which like reference numerals denote like elements as between the various drawings. The drawings, briefly described below, are not to scale.

DETAILED DESCRIPTION

In the following detailed description, numeric ranges are provided for various aspects of the embodiments described. These recited ranges are to be treated as examples only, and are not intended to limit the scope of the claims hereof. In addition, a number of materials are identified as suitable for various facets of the-embodiments. These recited materials are to be treated as exemplary, and are not intended to limit the scope of the claims hereof.

Figure 1A:
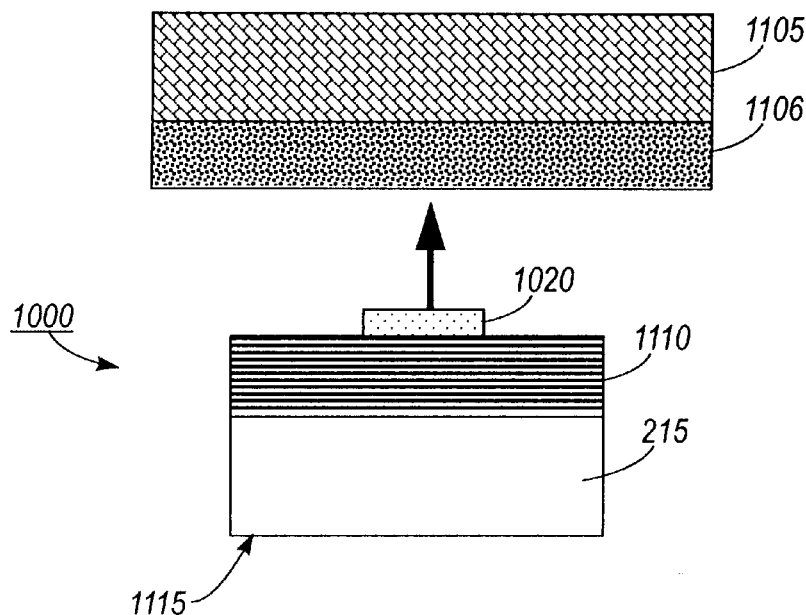
FIGS. 1a–1g show the steps for removing the sapphire growth substrate and adding a thermally and electrically conducting substrate to a laser structure in an embodiment in accordance with the invention.

With respect to FIG. 1a, removal of optically transparent substrate 215 is useful for nitride laser diodes because removal of optically transparent substrate 215 allows advantages that include realization of a vertical electrical contact structure, better heat sinking and mirror facets that are cleaved.

In an embodiment in accordance with the invention, FIGS. 1a–1g schematically show the steps for removal of optically transparent substrate 215, typically sapphire, by laser liftoff and bonding of semiconductor membrane 1110 to thermally conductive final substrate 1138 using supporting substrate 1105. Semiconductor membrane 1110 is typically an InGaAlN type film. Initially, backside 1115 of optically transparent substrate 215 is polished to a very smooth surface finish to reduce light scattering off backside 1115. Polishing is accomplished mechanically using a succession of diamond pads. During the polishing procedure, the diamond grit size is gradually reduced from 30 $\mu$m grit down to 0.1 $\mu$m grit. An optimal grit size of 16 $\mu$m is sufficient to reduce the light scattering from backside 1115 of optically transparent substrate 215 if it is made of sapphire. Typical root mean square (rms) roughness after polishing is about 20–50 Angstrom. Adequate surface roughness on the side of optically transparent substrate 215 exposed to the excimer laser is a critical aspect of the laser lift-off process. Destructive interference due to the formation of a Fabry-Perot cavity may occur within an optically transparent substrate 215 that is highly polished on the front side and backside 1115. The destructive interference attenuates the laser energy flux through optically transparent substrate 215. The Fabry-Perot cavity may be eliminated by roughening one side of the polished surface of optically transparent substrate 215. In an embodiment in accordance with the invention, backside 1115 of optically transparent substrate 215 is roughened by sand blasting backside 1115 to reduce its reflective properties to the order of the polished surface roughness achieved using diamond grit.

An important aspect to the laser lift-off process is the attachment of support substrate 1105. The bonding interface between the semiconductor membrane 1110 and support substrate 1105 must withstand the thermoelastic stress wave associated with the rapid heating and cooling of the semiconductor thin film during the laser processing. Additionally, support substrate 1105 must match the characteristic impedance of semiconductor membrane 1110 in order to minimize the effect of a reflected stress wave that may degrade the transferred film. For a single transfer process to be used bonding material 1106 and support substrate 1105 are required to fulfill the following conditions: 1) the bond is electrically and thermally conductive, 2) possess the same or similar characteristic impedance, and 3) robust enough to withstand typical laser device processing.

Figure 1B:
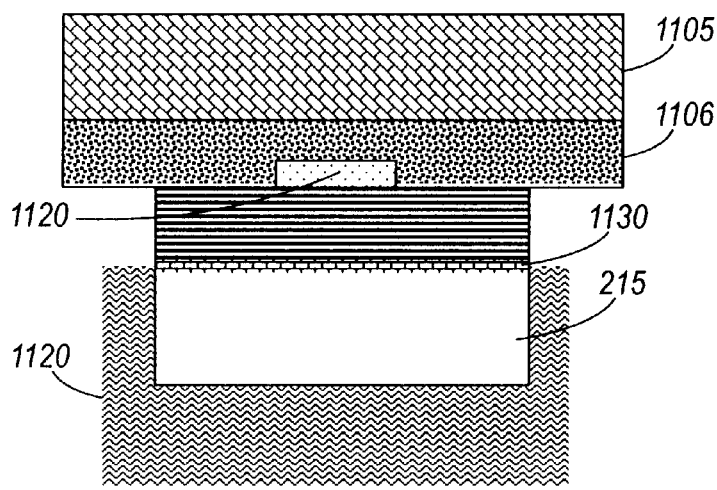
Figure 1C:
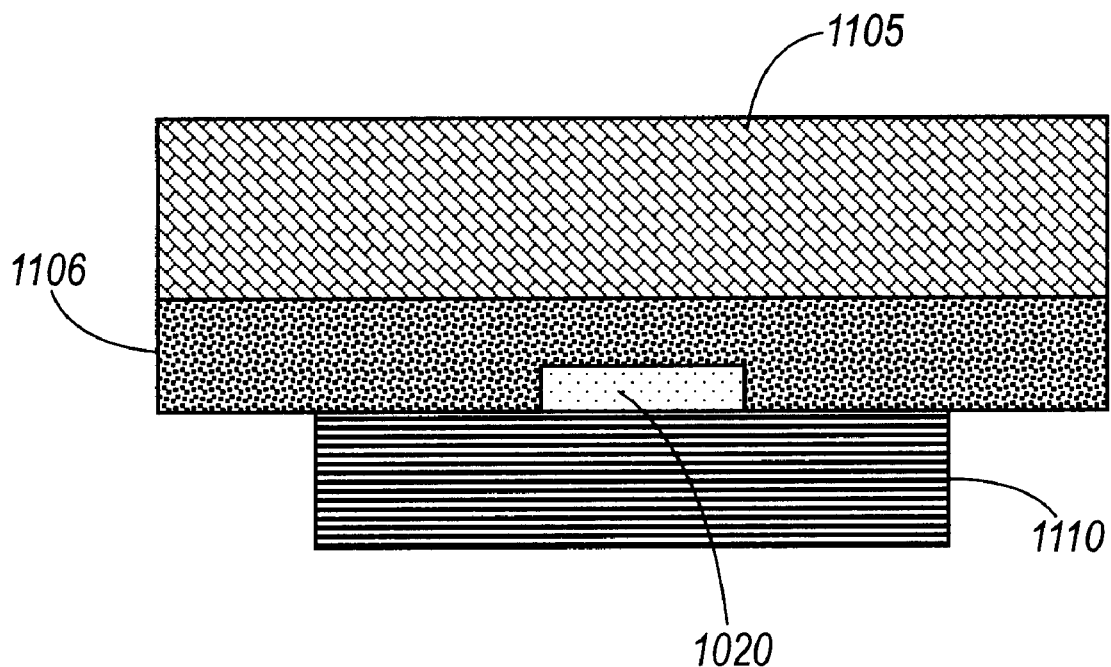
Figure 1C:
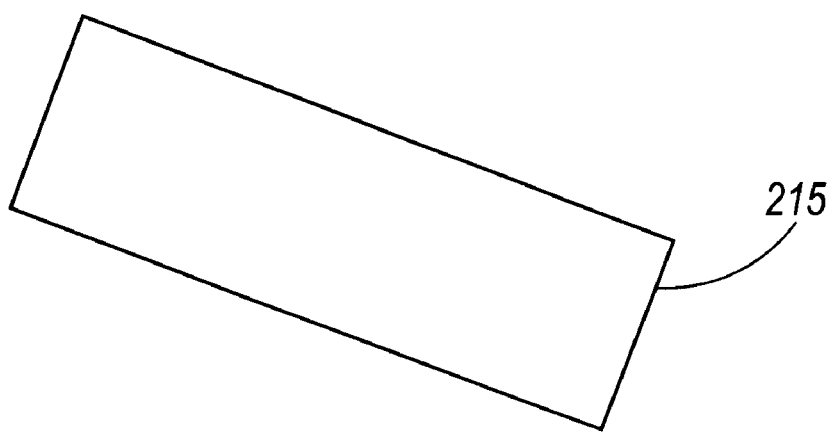
Figure 1D:
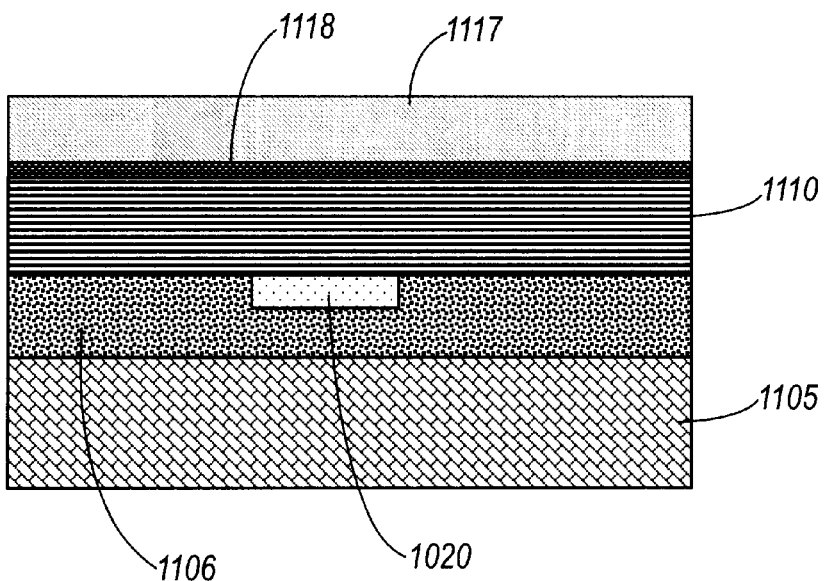
Figure 1E:
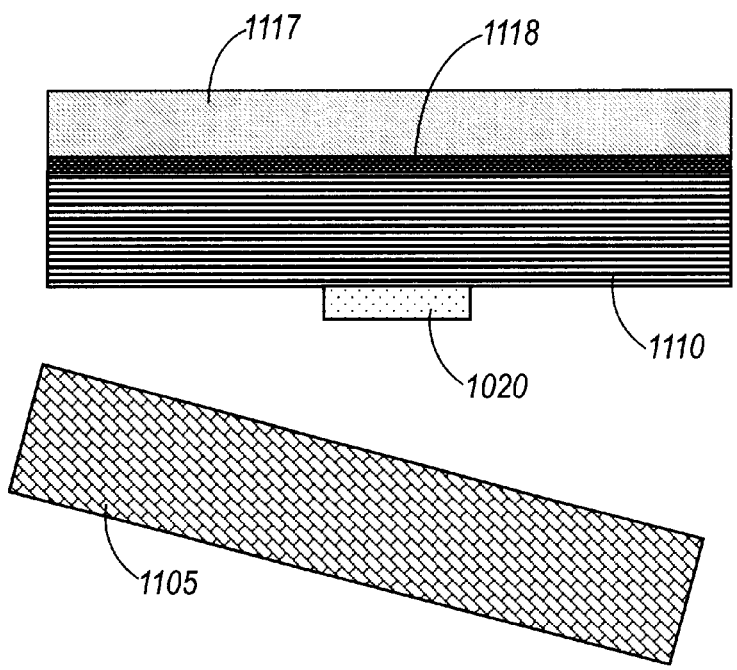
Figure 1F:
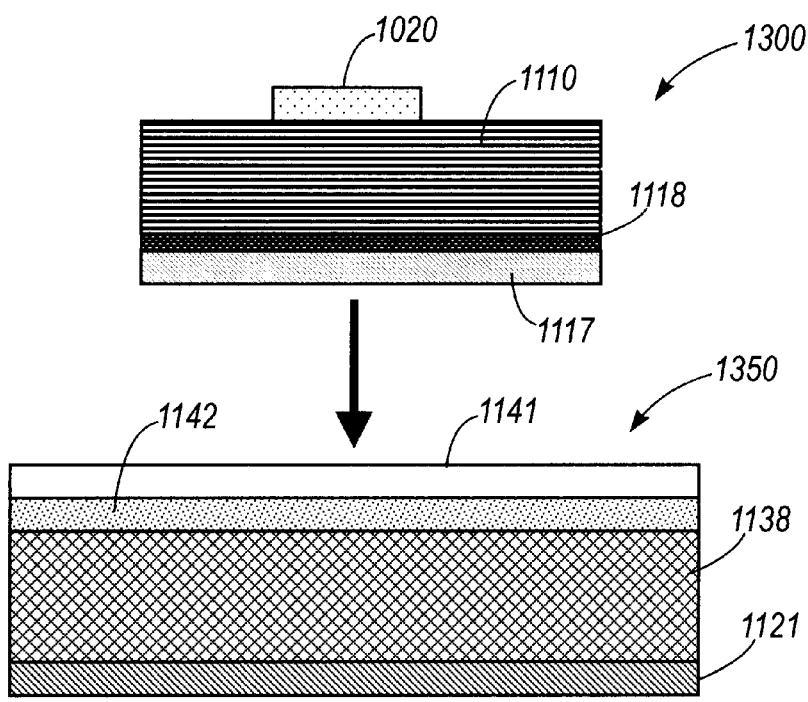

A two-step transfer process in an embodiment in accordance with the invention provides greater flexibility to integrate the nitride-based device onto final substrate 1138 (see FIG. 1f). The first step involves removing optically transparent substrate 215 using supporting substrate 1105 and bonding material 1106 selected to fulfill conditions 2 and 3 above. The second step involves removal of bonding material 1106 and release of supporting substrate 1105 to make semiconductor membrane 1110 free-standing or alternatively secondary support layer 1117 may be attached to semiconductor membrane 1110 prior to release from support substrate 1105 so that semiconductor membrane 1110 is not free-standing. Semiconductor membrane 1110 is then mounted onto final substrate 1138. In a two-step process, initial bonding material 1106 (step 1) needs to be easily removable from support substrate 1105, allowing subsequent transfer of the semiconductor membrane 1110 from support substrate 1105 onto final substrate 1138. Adding the second step removes the constraint that conditions 1, 2, and 3 need to be fullfilled simultaneously in one processing step. An embodiment in accordance with the invention uses a cyanoacrylate-based bonding material 1106 to bond semiconductor membrane 1110 onto impedance-matched supporting substrate 1105, typically Si, to alleviate requirements 2) and 3). Bonding material 1106 is soluble in organic solvents allowing semiconductor membrane 1110 to be later detached from the support and transferred onto substrate 1138. Bonding material 1106 may also be a wax, epoxy or other organically soluble adhesive.

In an embodiment in accordance with the invention, FIG. 1a shows mounting of laser diode structure 1000 to supporting substrate 1105 with wax, epoxy or ethyl-cyanoacrylate-based bonding material 1106 to provide support for the semiconductor membrane 1110 after removal of optically transparent substrate 215 and prior to transferring semiconductor membrane 1110 onto final substrate 1138. P-contact 1020 provides an electrical contact to laser diode structure 1000. FIG. 1b shows exposure of substrate 215 and semiconductor membrane 1110 to ultraviolet excimer laser light 1120. Proper adjustment of the excimer laser (not shown) allows decomposition of thin GaN layer 1130 at the interface between optically transparent substrate 215 and semiconductor membrane 1110. GaN layer 1130 is decomposed into Ga metal and $N_2$.

For a XeCl excimer laser operating at 308 nm the laser energy range after passage through a homogenizer is typically about 300 to 600 mJ/cm$^2$ with a beam size of about 5 mm by 5 mm. A homogenizer converts a Gaussian-like laser beam to a flat plateau-like laser beam which provides improved beam uniformity. Larger areas may be exposed by scanning the laser beam across backside 1115. The excimer laser is typically pulsed in the range of 1–10 Hz with one pulse typically being sufficient to achieve decomposition of GaN layer 1130. Backside 1115 allows uniform excimer laser exposure of GaN layer 1130. FIG. 1c shows separation of sapphire substrate 215 from semiconductor membrane 1110 at the interface by heating laser diode structure 1000 (see FIG. 1a) which is bonded to support substrate 1105 to a temperature in the range of about 30°–70° C. Residual Ga metal layer 1130 on semiconductor membrane 1110 at the interface is removed with a hydrochloric acid (HCl) dip that is equal parts distilled water. Approximately 1 $\mu$m of the damaged film at the interface on semiconductor membrane 1110 is removed by dry-etching in an $Ar/Cl_2/BCl_3$ gas mixture. Typically, chemically assisted ion beam etching (CAIBE) or reactive ion etching (RIE) is used for the dry-etch. Low energy (less than about 400 eV) Ar ion sputtering is employed after the dry-etch to reduce any surface damage caused by the dry-etching.

Once semiconductor membrane 1110 is detached and transferred from optically transparent substrate 215 (FIG. 1c), secondary support layer 1117 is then attached onto semiconductor membrane 1110 bonded to support substrate 1105 (FIG. 1d). Attachment of secondary support layer 1117 may also follow deposition of n-metal layer 1118 or secondary support layer 1117 may be directly attached onto membrane 1110. Ideally n-metal layer 1118 is chosen so that it provides a low contact-resistance ohmic backside n-contact. Secondary support layer 1117 will act as an intermediate transfer and bonding layer to final substrate 1138. Typically, secondary support layer 1117 is an elastically-compliant material such as indium, gold, copper or silver which also possesses high electrical and thermal conductivity. Using a material having a relatively low melting point such as indium ($T_m$=156° C.), facilitates a low-temperature post-laser liftoff bonding process. Secondary support layer 1117 also functions to stress semiconductor membrane 1110 to oppose the bowing and resultant cracking caused by the residual stress present in semiconductor membrane 1110 due to release of semiconductor membrane 1110 from optically transparent substrate 215. The stress is typically about 0.4 GPa for semiconductor membrane 1110 which is typically a 3 $\mu$m thick GaN film.

Secondary support layer 1117 may also function as the n-contact to semiconductor membrane 1110. Typically, 3–5 $\mu$m thick indium is chosen for secondary support layer 1117 and secondary support layer 1117 effectively bonds semiconductor membrane 1110 onto final substrate 1138. After depositing secondary support layer 1117, semiconductor membrane 1110 and support structure 1105 are immersed in an organic solvent to release the ethyl-cyanoacrylate adhesive layer from step 1 described above (see FIG. 1e).

Figure 1G:
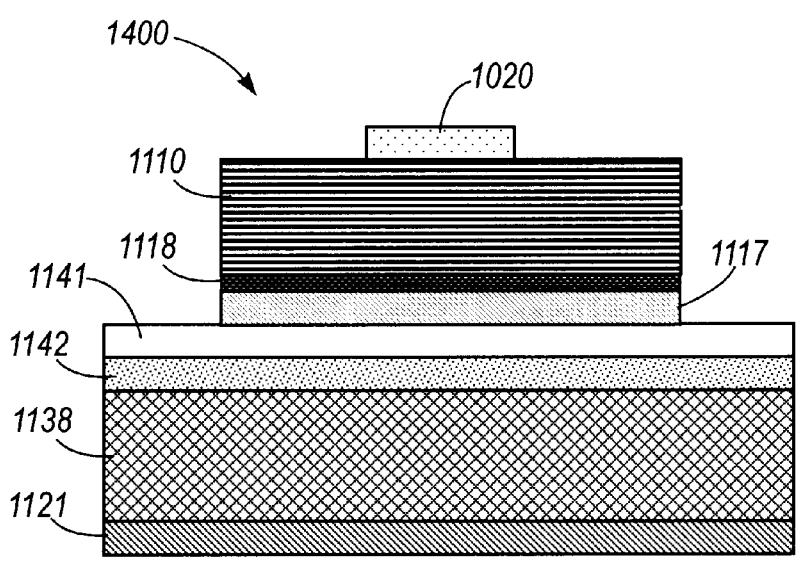
Figure 1H:
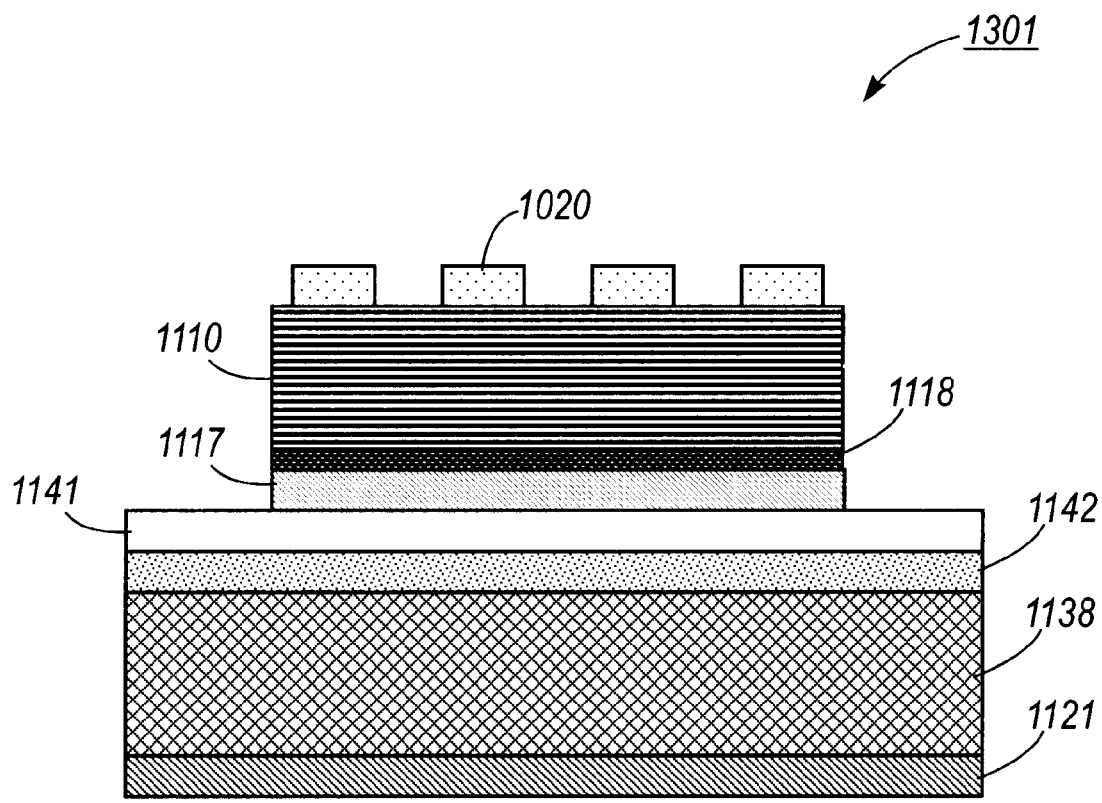
FIG. 1h shows a laser diode array structure in an embodiment in accordance with the invention.
Figure 2A:
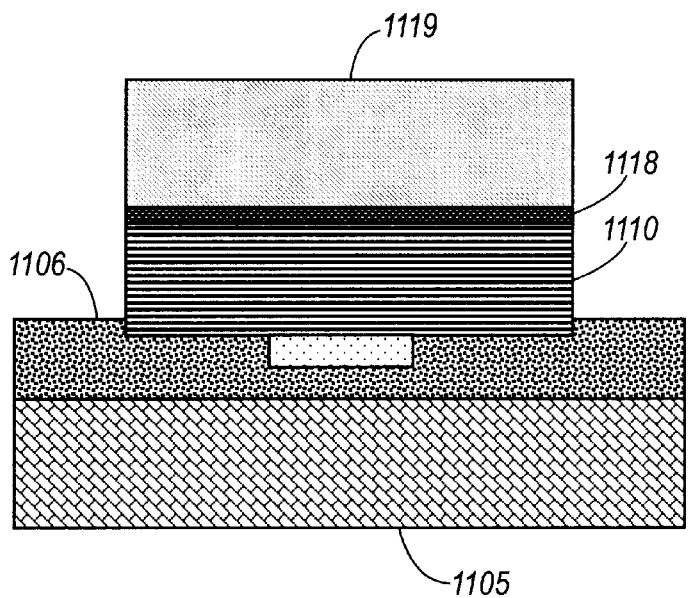
FIGS. 2a–2b show the steps for removing the sapphire growth substrate and depositing a new thermally conductive host substrate onto a laser diode structure in an embodiment in accordance with the invention.
Figure 2B:
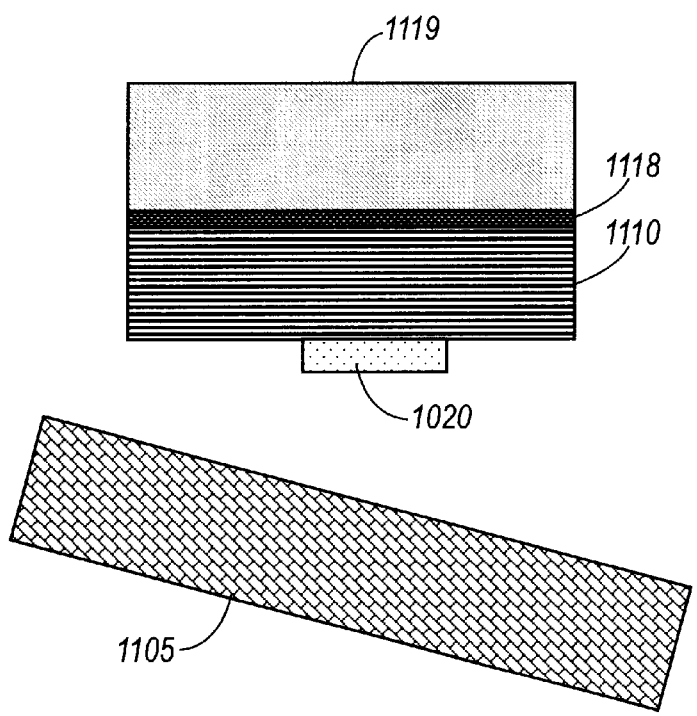

With reference to FIG. 1f, metal back-contact layer 1121, typically made of Ti/Au or Ti/Al is deposited by thermal or e-beam evaporation on final substrate 1138 that is typically silicon, silicon carbide or diamond. At the bonding interface, metal contact layer 1142 and bonding layer 1141 are deposited. Bonding layer 1141 may be a low-temperature metal, such as indium, that is thermally and electrically conductive to the contact metal. The thickness of bonding layer 1141 can vary from about 1 $\mu$m to 5 $\mu$m. With reference to final substrate 1138, silicon is an economical substrate material that is electrically and thermally (about 1.5 W/cmK at room temperature and about 0.97 W/cmK at 100° C.) conductive and allows mirror cleaving and integration of a silicon driver chip with laser diodes. Silicon carbide is an expensive substrate material that is electrically and thermally (about 5 W/cmK at room temperature and about 3.2 W/cmK at 100° C.) conductive and allows mirror cleaving. Diamond is a very expensive substrate material that is the best known thermal conductor (about 20 W/cmK at room temperature and about 15.5 W/cmK at 100° C.) and can be metalized to be conductive while allowing mirror cleaving. Structure 1300 is attached to structure 1350 as shown in FIG. 1f to create final structure 1400 shown in FIG. 1g. FIG. 1h shows four laser array 1301 made in essentially similar fashion to single laser structure 1300.

Alternatively, structure 1300 in FIG. 1f can be mounted directly onto the sub-mount of a laser package after cleaving or dicing semiconductor membrane 1110 into individual dies. If a low-melting point metal, such as In (indium), is deposited as secondary support structure 1117 then a low-temperature anneal may be used to improve the bond interface between semiconductor membrane 1110 and the final substrate 1138. By melting secondary support layer 1117 and metal bonding layer 1141, any particulates or asperities may be consumed when the metal interface melts, improving the adhesion of the film. Because the secondary support layer 1117 is elastically compliant, the adhesion of the device can further be improved by mechanically pressing semiconductor membrane 1110 onto final substrate 1138.

The use of a low-melting point metal, such as indium, for bonding at the bond interface does not allow n-metal layer 1118 to be alloyed since the melting point of indium metal in secondary support layer 1117 and bonding layer 1106 is below the alloying temperature of n-metal layer 1118, typically about 500° C. for Ti/Al (see FIG. 1d). One solution is having the final substrate 1138 coated with metal layer 1141 that is reactive to the secondary support layer 1117. For example, Pd and In for a Pd:In ratio of 1:3, react at low temperatures (T~200° C.) to form the intermetallic $PdIn_3$ which has a melting point of 664° C. (see W. S. Wong et al. J. Electron. Mater. 28, 1409 (1999)). After creating final structure 1400 using intermetallic $PdIn_3$, final structure 1400 may be heated to 500° C. for alloying n-metal layer 1118. Other methods have also been demonstrated by using Van der Waals forces to bond free-standing membranes onto other substrates (see E. Yablonovitch, T. Gmitter, J. P. Harbison, and R. Bhat, Appl. Phys. Lett. 51, 2222 (1987), and T. Sands, U.S. Pat. No. 5,262,347).

A solder layer may also be used for bonding layer 1141. Depending on the composition of bonding layer 1141 and final substrate 1138, bonding layer 1141 and final substrate 1138 are heated to the appropriate bonding temperature in a forming gas atmosphere to avoid oxide formation. A bonding temperature of about 180° C. is typically used when using indium for bonding layer 1141. If a Pd or Au film has not been deposited on the exposed surface of bonding layer 1141, flux or a hydrochloric acid dip prior to heating may be used to remove any oxide present on the exposed surface of bonding layer 1141. Other well-known techniques for oxide removal may also be used. When using PbSn for bonding layer 1141, a bonding temperature of about 220° C. is typically used. Oxide may be removed as described above prior to bonding if an Au film has not been applied to the exposed surface of bonding layer 1141.

In an embodiment in accordance with the invention, Au—Au thermo-compression bonding may be used to bond semiconductor membrane 1110 to final substrate 1138. Au—Au thermo-compression bonding provides for better thermal contact between semiconductor membrane 1110 and final substrate 1138. Note, bonding layer 1141 is not present if Au—Au thermo-compression bonding is used to join final substrate 1138 to semiconductor membrane 1110. A typical bonding temperature for Au—Au thermo-compression is about 350° C.

Final structure 1400 (FIG. 1g) is cooled to about 20° C. while a bond load is applied. For example, the bond load used with In or PbSn solder is about 200 grams if the bonding area is 25 mm². If Au—Au thermo-compression bonding is used, the bond load is typically about 1500 g/mm².

In addition, in an embodiment in accordance with the invention, the secondary support can be engineered to maintain the intrinsic residual stress of semiconductor membrane 1110 thus minimizing the possibility of mechanical failure of semiconductor membrane 1110. For example, a 1 $\mu$m thick sputtered MoCr film may be manipulated to possess an internal stress gradient between 1 GPa compressive to tensile by varying the sputtering process pressure during deposition (e.g. see U.S. Pat. No. 5,914,218). These stresses are adequate to offset the residual compressive stress in GaN-based materials typically reported to be 0.4–1 GPa. The secondary support layer 1117 can effectively stress the free-standing membrane in an opposing gradient thereby removing any bowing and assist in flattening the device structure for subsequent layer transfer.

Figure 3A:
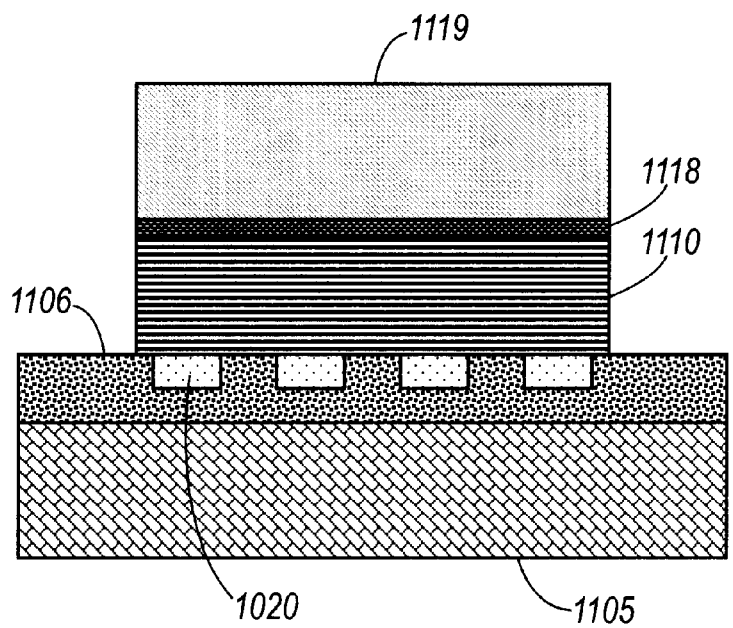
FIGS. 3a–3b show the steps for removing the sapphire growth substrate and depositing a new thermally and electrically conductive host substrate onto a laser diode structure in an embodiment in accordance with the invention.
Figure 3B:
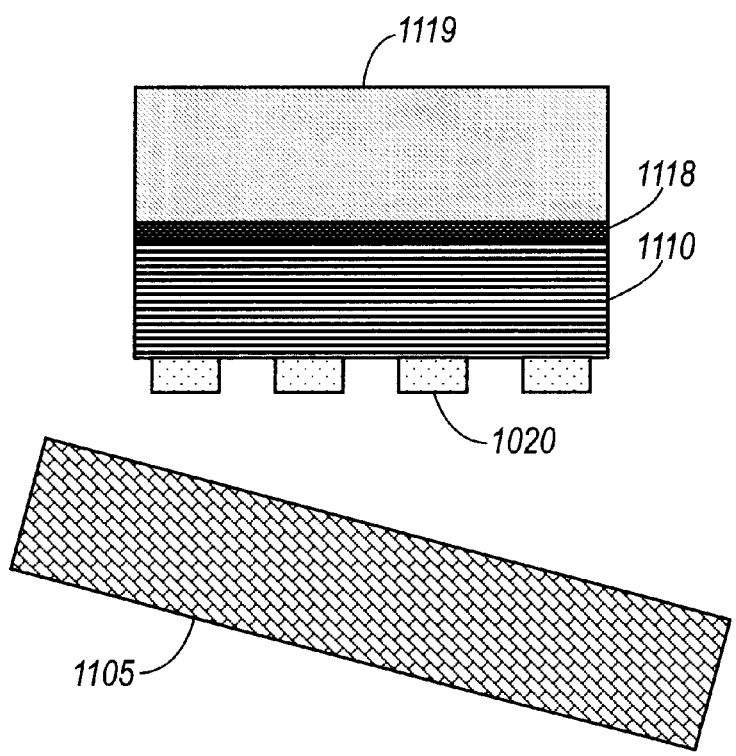

Another embodiment in accordance with the invention (see FIGS. 2a–2b and FIGS. 3a–3b) attaches support layer 1119 onto support structure 1105 and semiconductor membrane 1110 structure after liftoff (see FIG. 1d) and prior to solvent immersion (see FIG. 1e). Support layer 1119 (approximately 100–500 $\mu$m thick) acts as a new host substrate for the semiconductor membrane 1110 after release from support structure 1105. This step eliminates the need to handle free-standing semiconductor membrane 1110. Support layer 1119, such as a Cu layer which is a good thermal conductor (about 4 W/cmK), is typically deposited by electroplating at room temperature onto exposed semiconductor membrane 1110 creating semiconductor membrane 1110 attached to Cu support layer 1119. New support layer 1119 is structurally strong enough to withstand handling but also thin enough to allow semiconductor membrane 1110 to be cleaved to form parallel mirror facets. Other metals such as Ni or Au are also possible for support layer 1119. This approach is readily applicable to laser diode array structures as shown in FIGS. 3a and 3b for four laser diode array structure 1301.

Figure 4:
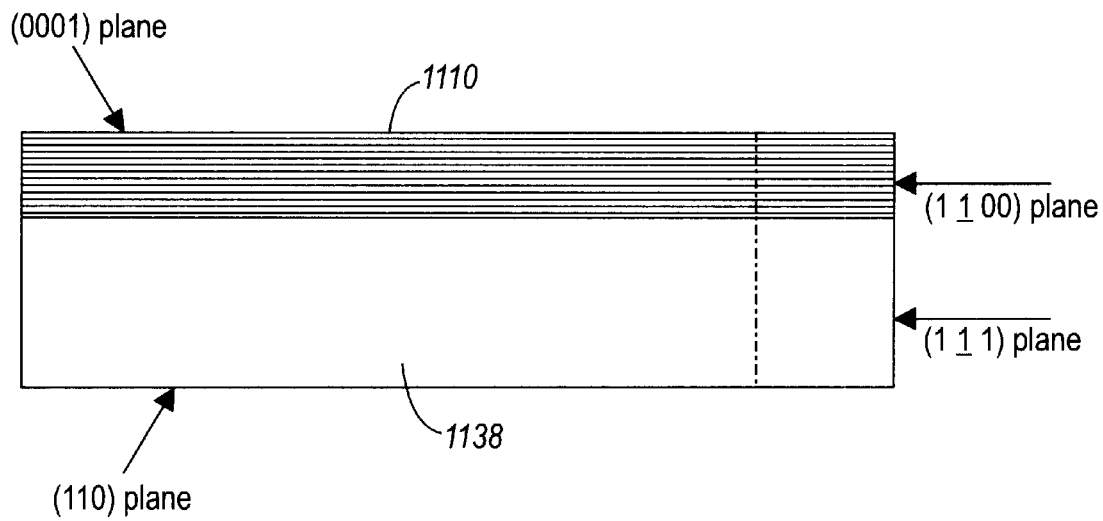
FIG. 4 shows crystal planes of silicon and InGaAlN membrane.
Figure 5:
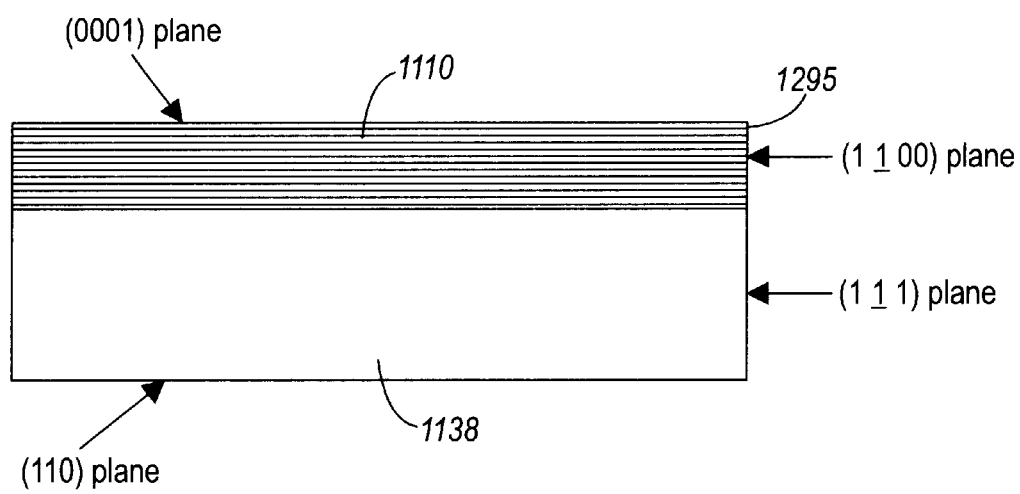
FIG. 5 shows cleaved facets in InGaAlN membrane in an embodiment in accordance with the invention.

In an embodiment in accordance with the invention, cleaved facets can be achieved on free-standing semiconductor membrane 1110 by cleaving along the {1100} plane of semiconductor membrane 1110 or after attaching membrane 1110 to final substrate 1138. In order to cleave along crystallographically oriented substrates, the vertical crystal planes of semiconductor membrane 1110 are aligned with the appropriate crystal planes of silicon, silicon carbide or diamond final substrate 1138 to allow for cleaving after bonding as shown in FIG. 1g. FIG. 4 shows a desired alignment of the relevant crystal planes of semiconductor membrane 1110 and final substrate 1138 prior to cleaving. Devices are cleaved along the {1100} planes of semiconductor membrane 1110 and the {111} planes of final substrate 1138. FIG. 5 shows the relevant crystal planes of semiconductor membrane 1110 and final substrate 1138 after cleaving for gallium nitride and silicon, respectively. Cleaved facet 1295 is also shown.

Figure 6:
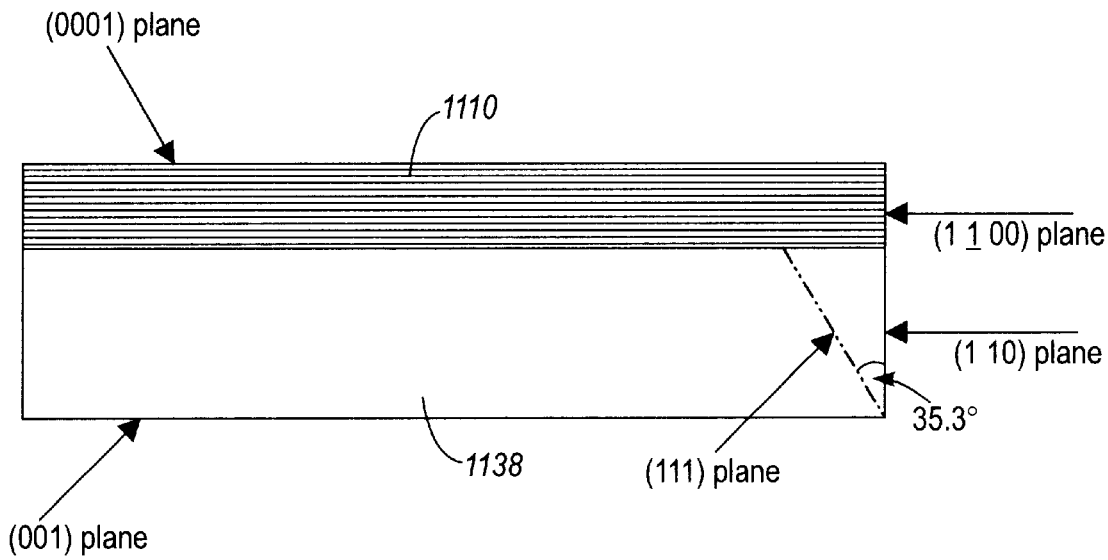
FIG. 6 shows crystal planes of silicon and InGaAlN membrane.
Figure 7:
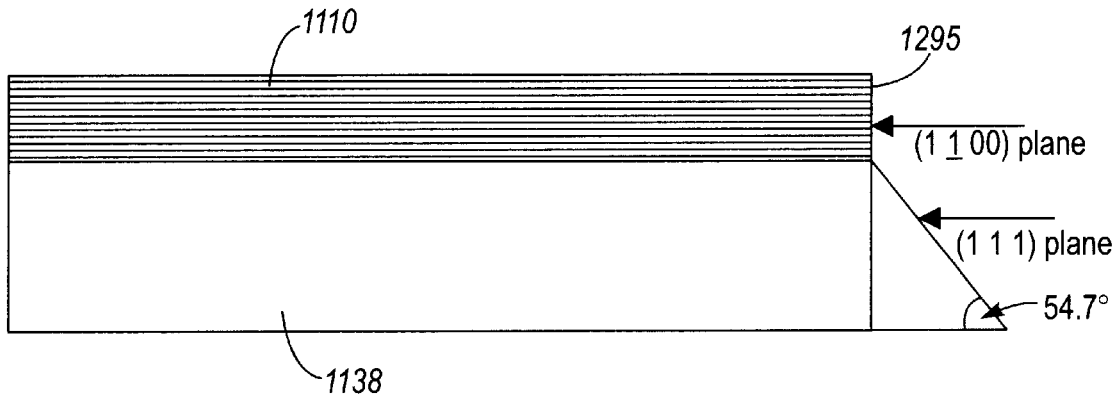
FIG. 7 shows cleaved facets in InGaAlN membrane in an embodiment in accordance with the invention.

In an embodiment in accordance with the invention, FIG. 6 shows a desired alignment of the relevant crystal planes of semiconductor membrane 1110 and final substrate 1138 prior to cleaving. In FIG. 6, the {111} crystal plane of final substrate 1138 is parallel to the {1100} crystal plane of semiconductor membrane 1110. This orientation allows an easier cleave of final substrate 1138 as seen in FIG. 7 which shows the relevant crystal planes of semiconductor membrane 1110 and final substrate 1138 after cleaving.

After proper alignment of the relevant crystal planes of semiconductor membrane 1110 and final substrate 1138, semiconductor membrane 1110 is bonded to final substrate 1138 in an embodiment in accordance with the invention. Layer 1141 is used for bonding. In the case of using a reactive metal bond interface, bonding layer 1141 and final substrate 1138 are heated to the appropriate bonding temperature in a forming gas atmosphere to avoid oxide formation.

Cleaving of laser diode facets 1295 (see FIGS. 5 and 7) is accomplished by propagating the cleave from the edge of, typically, silicon, silicon carbide or diamond final substrate 1138 into semiconductor membrane 1110. Alternatively, laser diode facets 1295 may be dry-etched using CAIBE in an Ar/Cl$_2$/BCl$_3$ gas mixture. The reflectivity of the laser diode facets 1295 may be increased by deposition of SiO$_2$/TiO$_2$ or SiO$_2$/HfO$_2$ high reflective coating using, for example, e-beam evaporation.

In an embodiment in accordance with the invention, cleaved facets may also be made on semiconductor membrane 1110 attached to secondary support layer 1117 prior to bonding to final substrate 1138. Semiconductor membrane 1110 is cleaved along {1100} plane and then mounted onto final substrate 1138. This eliminates the need to align semiconductor membrane 1110 with final substrate 1138. This process also allows placement of cleaved semiconductor membrane 1110 onto non-single crystal or amorphous substrates such as glass, plastic or metal.

While the invention has been described in conjunction with specific embodiments, it is evident to those skilled in the art that many alternatives, modifications, and variations will be apparent in light of the foregoing description. Accordingly, the invention is intended to embrace all other such alternatives, modifications, and variations that fall within the spirit and scope of the appended claims.

What is claimed is:

1. A method for making a nitride laser diode structure comprising:
   providing a semiconductor membrane having an optically transparent substrate attached on a first side of said semiconductor membrane;
   attaching a support substrate to a second side of said semiconductor membrane;
   removing said optically transparent substrate from said first side of said semiconductor membrane;
   placing an elastically-compliant support layer on said first side of said semiconductor membrane;
   releasing said semiconductor membrane from said support substrate; and
   placing said elastically-compliant support layer on a substrate having a high thermal conductivity.

2. The method of claim 1 wherein said optically transparent substrate is comprised of sapphire.

3. The method of claim 1 wherein the step of attaching said support substrate to said second side of said semiconductor membrane includes using wax to attach said support substrate to said second side.

4. The method of claim 1 wherein said semiconductor membrane is comprised of In, Ga, Al and N.

5. The method of claim 1 wherein said thermally conducting substrate includes a material selected from the group consisting of silicon, silicon carbide, copper, gold and diamond.

6. The method of claim 1 wherein said nitride laser diode structure is an array of nitride laser diodes.

7. The method of claim 1 wherein the step of attaching said thermally conducting substrate to said first side of said semiconductor membrane includes putting a solder layer on said thermally conducting substrate.

8. The method of claim 1 wherein the step of removing said optically transparent substrate includes exposing said optically transparent substrate to laser light.

9. The method of claim 3 wherein said solder layer includes a material selected from the group consisting of In, PbSn, and AuSn.

10. The method of claim 6 wherein the step of removing said optically transparent substrate includes polishing of said optically transparent substrate prior to exposure to laser light.

* * * * *